US012260926B2

(12) United States Patent
Prather et al.

(10) Patent No.: US 12,260,926 B2
(45) Date of Patent: Mar. 25, 2025

(54) LOOPBACK DATAPATH FOR CLOCK QUALITY DETECTION

(71) Applicant: Micron Technology, Inc., Boise, ID (US)

(72) Inventors: Matthew Alan Prather, Boise, ID (US); Won Ho Choi, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 18/312,280

(22) Filed: May 4, 2023

(65) Prior Publication Data

US 2023/0395175 A1 Dec. 7, 2023

Related U.S. Application Data

(60) Provisional application No. 63/347,886, filed on Jun. 1, 2022.

(51) Int. Cl.
*G11C 29/12* (2006.01)
(52) U.S. Cl.
CPC .... *G11C 29/12015* (2013.01); *G11C 29/1201* (2013.01)
(58) Field of Classification Search
CPC ............... G11C 29/12015; G11C 29/12
USPC ......................................................... 365/201
See application file for complete search history.

(56) References Cited

U.S. PATENT DOCUMENTS

| | | | |
|---|---|---|---|
| 8,917,128 B1* | 12/2014 | Baek | G11C 7/222 327/158 |
| 9,496,878 B2* | 11/2016 | Choi | H03K 21/00 |
| 2012/0159271 A1* | 6/2012 | Cho | G11C 29/1201 714/717 |
| 2017/0285718 A1* | 10/2017 | Lai | G06F 1/324 |
| 2022/0413709 A1* | 12/2022 | Kato | G06F 3/0679 |

* cited by examiner

*Primary Examiner* — Muna A Techane
(74) *Attorney, Agent, or Firm* — Fletcher Yoder , P.C.

(57) ABSTRACT

Devices and methods include transmitting loopback signals for monitoring operation of a memory device. In some embodiments, a memory device may receive a system clock signal from a host device and may generate an internal clock signal based at least in part on the system clock signal. In some embodiments, the memory device may generate a loopback signal based at least in part on the internal clock signal and may transmit the loopback signal via a loopback datapath associated with the memory device. A host device may compare the internal clock signal and the system clock signal to determine a fidelity of the internal clock signal. Termination values of the memory device may be adjusted based on the determined fidelity of the internal clock signal.

24 Claims, 6 Drawing Sheets

LOOPBACK DATAPATH FOR CLOCK QUALITY DETECTION

CROSS-REFERENCE TO RELATED APPLICATIONS

This application claims priority to U.S. Provisional Application No. 63/347,886, filed Jun. 1, 2022, entitled "LOOPBACK DATAPATH FOR CLOCK QUALITY DETECTION," the disclosure of which is incorporated by reference in its entirety for all purposes.

BACKGROUND

Field of the Present Disclosure

Embodiments of the present disclosure relate generally to memory devices. More specifically, embodiments of the present disclosure relate to monitoring operation of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). In this manner, the processor may communicate with the memory device, for example, to retrieve executable instructions, retrieve data to be processed by the processor, and/or store data output from the processor.

To facilitate improving operational reliability, operation of a memory device may be monitored, for example, by a host controller (e.g., the processor) to facilitate debugging operations of the memory device and/or to facilitate performing diagnostics on the memory device. In some instances, operation of a memory device may be monitored based on an analysis of an internal clock signal from the memory device. In other words, accuracy of operational monitoring may be affected by integrity of such signals returned from the memory device.

Embodiments of the present disclosure may be directed to one or more of the problems set forth above.

DETAILED DESCRIPTION

Figure 1:
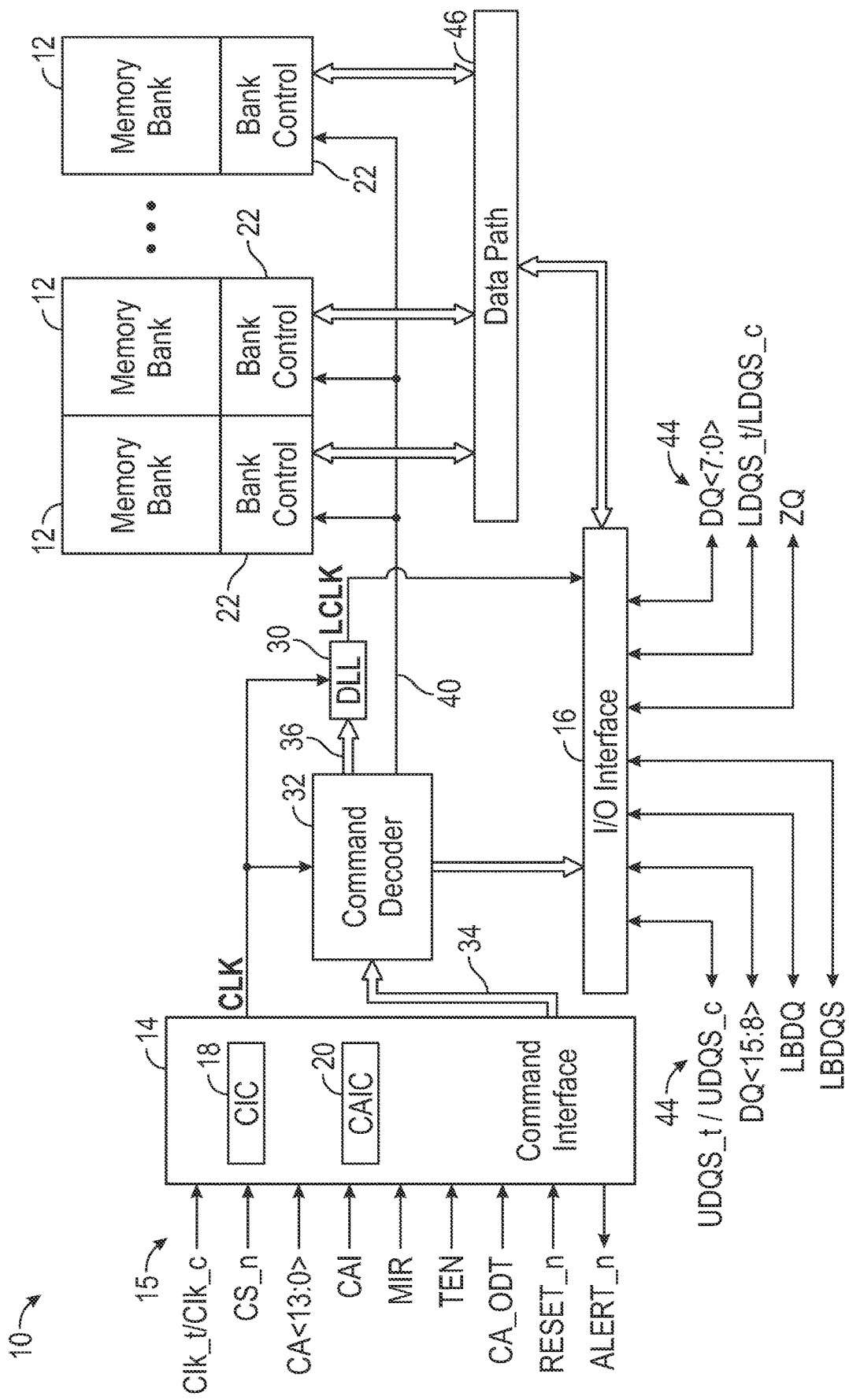
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

To facilitate monitoring operation of memory, the present disclosure provides techniques for implementing a loopback datapath (e.g., network) between one or more memory devices and/or host devices (e.g., host processors), which enables transmission of an internal clock signal (CLK) indicative of memory device operation. In some embodiments, a memory device may generate an internal clock signal based at least in part on a differential pair of system clock signals, referred to herein as the true clock signal (Clk_t) and the bar clock signal (Clk_b), received from the host device. As operating frequencies continue to increase to facilitate providing increased data transfer speeds, timing of signals may become even more important to maintain properly. In some embodiments, a memory device may generate and transmit the internal clock signal for analysis by the host device, for example, by comparing a number of edges of the internal clock signal and a number of edges of the system clock signal. A host controller may monitor (e.g., debug and/or diagnose) operation of the target memory device through the internal clock signal transmitted between the memory device and the host controller via a loopback datapath. In some instances, the host controller is included in and/or replaced by test or characterization equipment used to verify operation or to verify performance of the targeted memory device. For example, the testing may be performed during manufacturing and prior to installation of the targeted memory device in a computing system and/or on a memory module. Additionally or alternatively, the testing may be used for debug purposes in case of a system/device underperforming expectations in the field.

A clock performance analyzer may be implemented on a memory device to analyze performance of the internal clock signal. However, adding circuitry to the memory device may result in distortion of the internal clock signal due to increased capacitance and parasitic load. At least in some instances, distortion may affect signal integrity of the internal clock signal and, thus, negatively impact memory operations, diagnostics, and/or debugging performed based on the internal clock signal.

Thus, to facilitate improving memory operations, diagnostics, and/or debugging, the present disclosure provides techniques to facilitate improving internal clock signal integrity, for example, by implementing a loopback datapath for the internal clock signal for analysis by a host controller.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_b. The positive clock edge for DDR refers to the point where the rising true clock signal Clk_t crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_b and generates an internal clock signal CLK. The clock input circuit 18 may receive a set of termination values to facilitate proper impedance matching within the memory device 10. For example, the clock input circuit 18 may include an adjustable component (e.g., resistive component, capacitive component, and so forth) to facilitate proper impedance matching and prevent internal clock signal CLK degradation and/or improve internal clock signal CLK fidelity. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t and DQS_b) to provide differential pair signaling during reads and writes. For certain memory devices, such as a DDR5 SDRAM memory device, the differential pairs of DQS signals may be divided into upper and lower data strobe signals (e.g., UDQS_t and UDQS_b; LDQS_t and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. In certain embodiments, any number of mode registers may receive termination values for calibration and/or configuration of the clock input circuit 18. For example, the mode registers may select and/or adjust resistance values of a resistor based on the termination values to improve the internal clock signal CLK fidelity. Accordingly, it should be understood that the block diagram of FIG. 1 is only provided to highlight certain functional features of the memory device 10 to aid in the subsequent detailed description.

Figure 2:
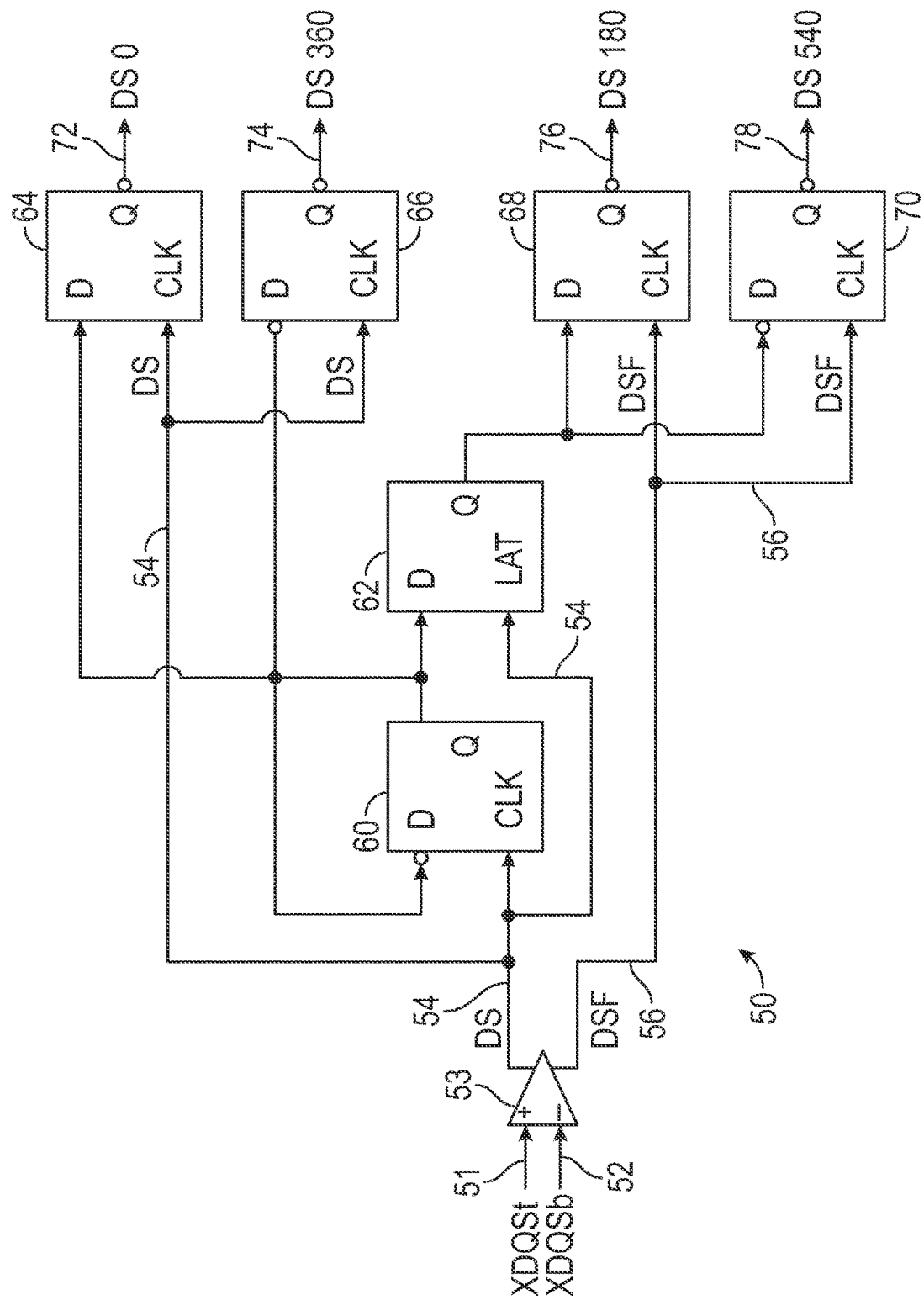
FIG. 2 is a schematic view of multi-phase generation circuitry used to receive a data strobe for a write command and to divide the data strobe into multiple phases, according to an embodiment of the present disclosure.

FIG. 2 illustrates a multi-phase generation circuitry 50 that may be implemented in the IO interface 16. The multi-phase generation circuitry 50 receives an external DQS (XDQSt) signal 51 (e.g., UDQS_t) that runs at the same speed as the clock and may be turned on or off. In some embodiments, as discussed previously, the external DQS signal 51 may be accompanied by an external bar DQS (XDQSb) signal 52 that is complementary to the external DQS signal 51. These signals may be transmitted to an amplifier 53 to provide an internal DS signal 54 and/or a complementary internal DS false signal 56. The amplifier 53 changes the power of the external DQS signal 51 from an external level to a level appropriate for use in the memory device 10.

As illustrated, the multi-phase generation circuitry 50 uses the internal DS signal 54 and/or the internal DS false signal 56 to divide the signal out using a toggle flip-flop 60 that toggles its output each time a pulse occurs on the internal DS signal 54. The multi-phase generation circuitry 50 also includes a latch 62 that latches the output from the toggle flip-flop 60 to track falling edges of the internal DS signal 54. In other words, the toggle flip-flop 60 sets a rising mode that causes changes of states in rising edge flip-flops 64 and/or 66 on rising edges of the internal DS signal 54. Moreover, the toggle flip-flop 60 and the latch 62 work together to set a falling mode that causes changes of state in falling edge flip-flops 68 and/or 70 during a falling edge of the internal DS signal 54.

DS0 72 corresponds to an output of the rising edge flip-flop 64. DS0 72 transitions high with every other rise of the external DQS signal 51. DS360 74 corresponds to a rising edge flip-flop 66. DS360 74 transitions high on rising edges of the external DQS signal 51 between those causing DS0 72 to go high. In other words, rising edges of the external DQS signal 51 alternate between causing DS0 72 and DS360 to go high.

DS180 76 corresponds to an output of the falling edge flip-flop 68. Due to the use of the internal DS false signal 56, DS180 76 transitions high with every other falling edge of the external DQS signal 51. Similarly, DS540 78 corresponds to an output of the falling edge flip-flop 70 and transitions high with the other alternating falling edges of the external DQS signal 51. In other words, single-edges of signals DS0 72, DS360 74, DS180 76, and DS540 78 each would cause toggles at a frequency of one-fourth of the double data rate of the external DQS signal 51. Additionally or alternatively, the frequency may be further divided to provide different frequencies relative to the internal DS signal 54. For example, additional flip-flops may be included to divide the DS0 72, DS360 74, DS180 76, and DS540 78 to each be one-quarter of the frequency of the internal DS signal 54.

Figure 3:
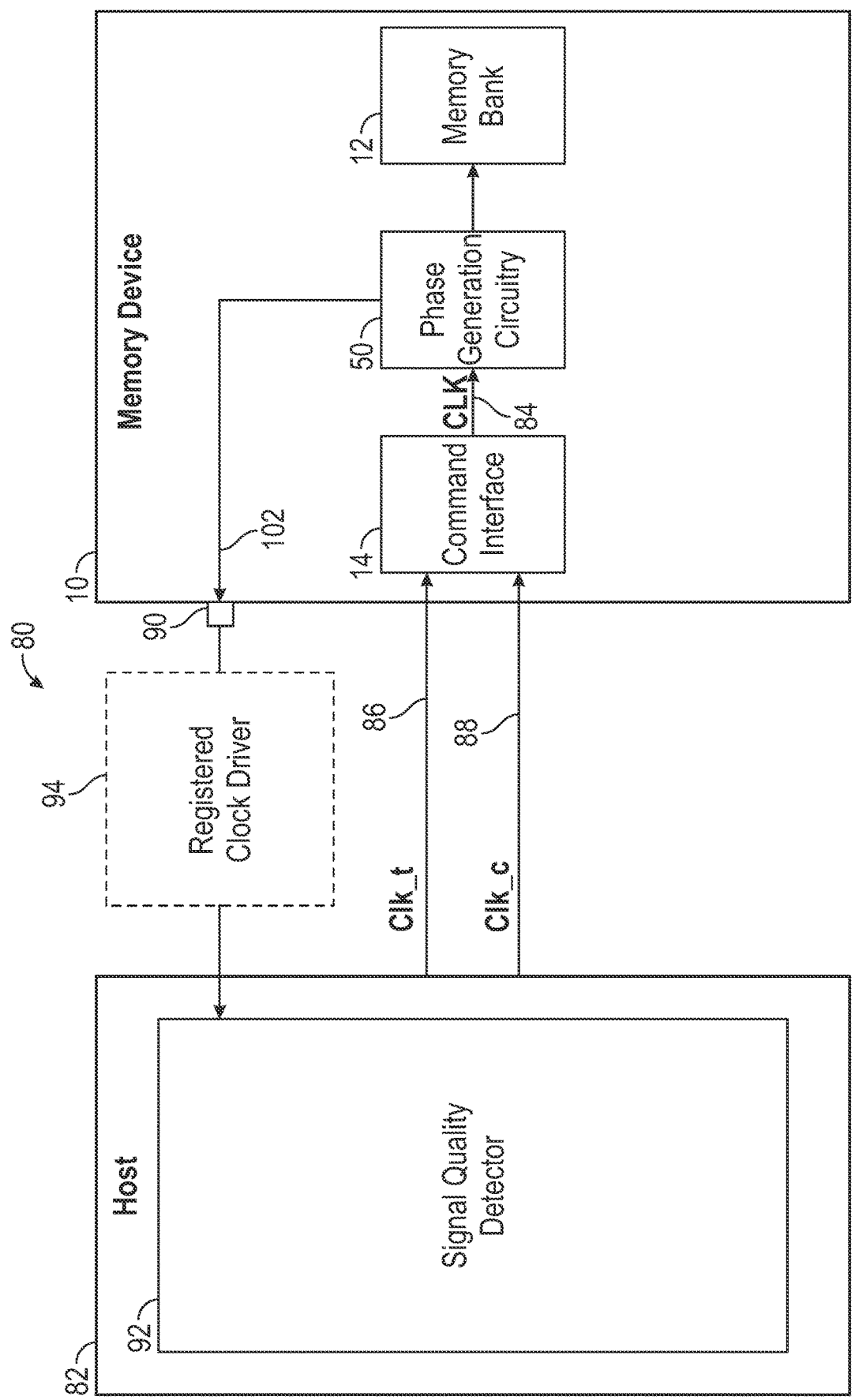
FIG. 3 is a block diagram of a memory system having a memory device and a loopback path for an internal clock signal through a loopback data pin, according to an embodiment of the present disclosure.

FIG. 3 is a block diagram of a memory system 80 including the memory device 10 and a host device 82. While only a single memory device 10 is illustrated in FIG. 2, the memory system 80 may include any number of memory devices. The host device 82 may receive the internal clock signal CLK 84 via a loopback datapath of the memory device 10. As described herein, the host device 82 may transmit system clock signals (true clock signal Clk_t 86 and bar clock signal Clk_c 88) to the memory device 10. The command interface 14 may receive the system clock signals and may generate the internal clock signal 84 based on the system clock signals. The memory device 10 may utilize a loopback path for transmission of a first loopback signal 102 to the host device 82. For example, the memory device 10 may transmit the first loopback signal 102 via a loopback data pin 90 (or via a loopback data strobe pin). That is, the memory device 10 may transmit the first loopback signal 102 as the loopback data signal LBDQ via the loopback data pin 90.

In certain embodiments, the memory device 10 may include the multi-phase generation circuitry 50 and the multi-phase generation circuitry 50 may receive the internal clock signal 84. The multi-phase generation circuitry 50 may generate the first loopback signal 102 based on the internal clock signal 84. The multi-phase generation circuitry 50 may generate the first loopback signal 102 based at least in part on the internal clock signal 84, for example, by down sampling and/or phase shifting the internal clock signal 84. For example, the multi-phase generation circuitry 50 may down sample the internal clock signal 84 by at least a factor of two (e.g., a factor of four, a factor of eight, and so forth) to generate the first loopback signal 102. In some embodiments, the multi-phase generation circuitry 50 may be disposed between the command interface 14 and the memory bank 12 and may transmit the internal clock signal 84 to the memory bank 12. Alternatively, the command interface 14 may bypass the phase generation circuitry 50 and transmit the internal clock signal 84 to the memory bank 12, as shown in FIG. 1. Additionally or alternatively, the multi-phase generation circuitry 50 may generate any number of down sampled and/or phase shifted clock signals for use within the memory device 10.

The host device 82 may include a signal quality detector 92 for analysis of the received first loopback signal 102 (e.g., the internal clock signal 84). For example, the signal quality detector 92 may receive the first loopback signal 102, the true clock signal 86, and the bar clock signal 88. In certain embodiments, the signal quality detector 92 may analyze one or more of the loopback signals to determine an integrity of the first loopback signal 102 and, thereby, an integrity of the internal clock signal 84. For example, the signal quality detector 92 may determine (e.g., count) a number of edges (e.g., rising, falling) of the first loopback signal 102 over a threshold time period (e.g., 5 milliseconds, 10 milliseconds, 100 milliseconds, and so forth). Additionally, the signal quality detector 92 may determine a number of edges of the true clock signal 86 and/or the bar clock signal 88 over the threshold time period. The signal quality detector 92 may compare the number of edges associated with the first loopback signal 102 and the number of edges associated with the true clock signal 86 to determine an integrity of the first loopback signal 102. For example, the signal quality detector 92 may count fewer edges for the first loopback signal 102 than the true clock signal 86. As such, the signal quality detector 92 may determine an integrity of first loopback signal 102 and, thereby, an integrity of the internal clock signal 84 based on the comparison. In some embodiments, the signal quality detector 92 may determine (e.g., compute) a difference between the number of edges for the first loopback signal 102 and the true clock signal 86. The host device 82 may compute new termination values for the system clock signals based on the difference. As such, the host device 82 may transmit the system clock signals to the memory device 10 with the new termination values to improve the internal clock signal 84 fidelity. In some embodiments, mode registers of the memory device 10 may receive termination values and/or may select the termination values for the clock input circuit 18. For example, the host device 82 may transmit the termination values to the memory device 10 and the mode registers may adjust operational parameters of a component (e.g., resistive component, capacitive component, and so forth) based on the termination values. Additionally or alternatively, the host device 82 may transmit a signal to instruct the memory device 10 to adjust termination values. For example, the host device 82 may transmit a signal indicative of poor internal clock signal integrity. The memory device 10 may receive the signal and may adjust termination values associated with the clock input circuit 18 in response to the signal. In certain embodiments, the signal may indicate a direction for the adjustment of the termination values (e.g., increase resistance values, decrease resistance values, and so forth). As such, the mode registers may select new termination values for the clock input circuit 18 based on the signal from the host device 82. Alternatively, the host device 82 may transmit a signal that only indicates the termination values may be adjusted. The memory device 10 may receive the signal and the mode registers may select new termination values in response. Additionally or alternatively, the host device 82 may compare the difference to a threshold difference amount and/or a threshold difference percentage.

In some embodiments, the memory system 80 may include a registered clock driver 94. The registered clock driver 94 may be communicatively coupled to the memory device 10 and the host device 82. The registered clock driver 94 may buffer the first loopback signal 102 between the memory device 10 and the host device 82. Additionally or alternatively, the first loopback signal 102 may have a frequency proportional (e.g., half, one-fourth, one-eighth, and so forth) to the frequency of the system clock signals. Accordingly, the signal quality detector 92 may determine a proportionality between the number of edges of the first loopback signal 102 and the number of edges the true clock signal 86. As such, the signal quality detector 92 may compare the proportionality between the number of edges and the proportionality of the clock signal frequencies to determine an integrity associated with the first loopback signal 102.

Figure 4:
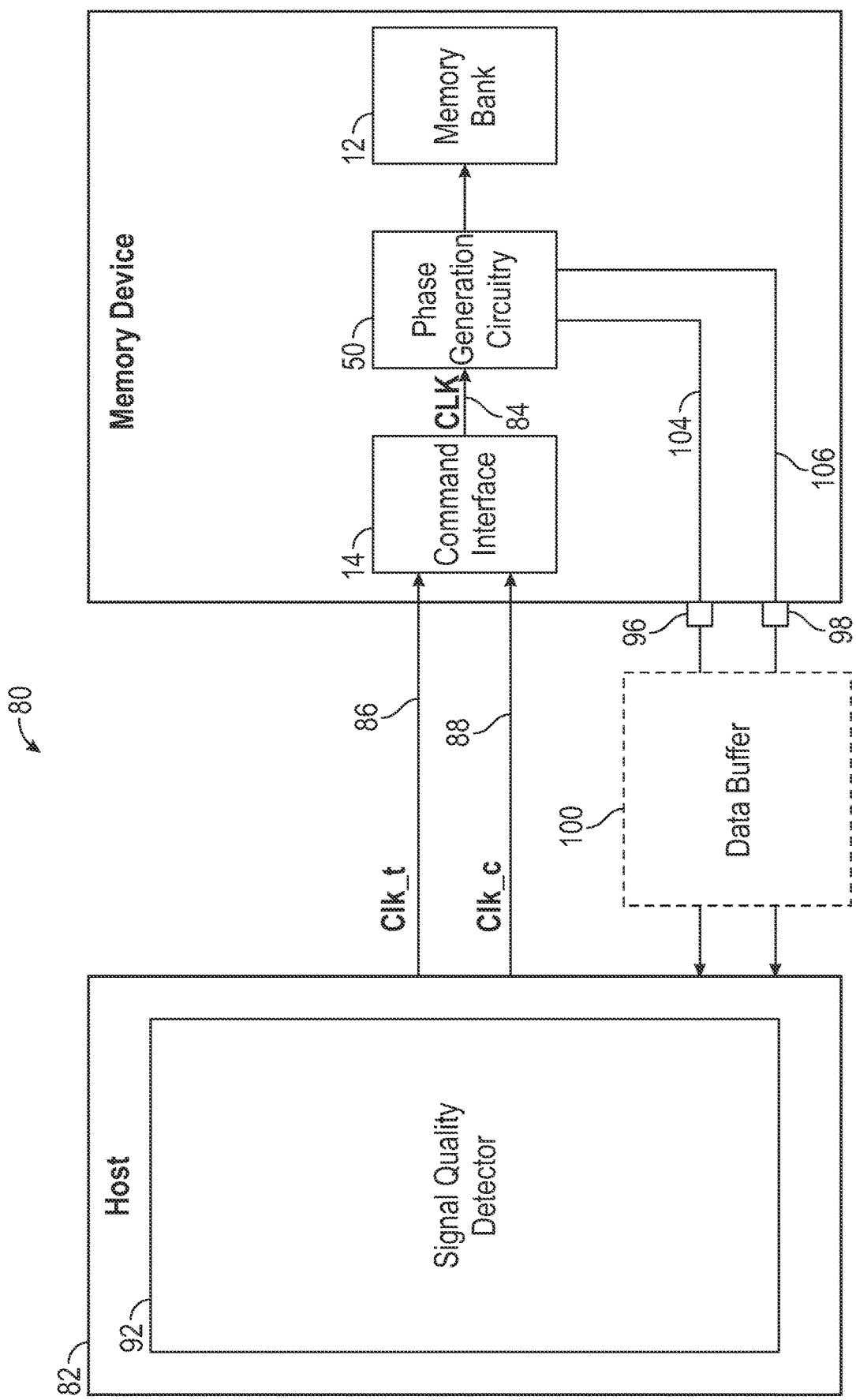
FIG. 4 is a block diagram of the memory system having a datapath for the internal clock signal through a data pin and a strobe pin, according to an embodiment of the present disclosure.

FIG. 4 is a block diagram of another embodiment of the memory system 80 including the memory device 10 and the host device 82 having a datapath for the internal clock signal through a data pin and a strobe pin. While only a single memory device 10 is illustrated in FIG. 3, the memory system 80 may include any number of memory devices. The memory device may utilize a datapath for transmission of the internal clock signal 84 to the host device 82. For example, the memory device 10 may transmit a second loopback signal 104 via a data pin 96 and a third loopback signal 106 via a strobe pin 98.

The multi-phase generation circuitry 50 may generate the second loopback signal 104 and/or the third loopback signal 106 based at least in part on the internal clock signal 84, for example, by down sampling and/or phase shifting the internal clock signal 84. For example, the multi-phase generation circuitry 50 may down sample the internal clock signal 84 by a first factor (e.g., a factor of two, a factor of four, a factor of eight, and so forth) to generate the second loopback signal 104 and/or may down sample the internal clock signal 84 by a second factor to generate the third loopback signal 106. Additionally or alternatively, the multi-phase generation circuitry 50 may generate the second loopback signal 104 and/or the third clock signal at a same frequency as a frequency of the internal clock signal 84.

In certain embodiments, the second loopback signal 104 and the third loopback signal 106 may be defined as a double data rate signal to be transmitted via the data pin 96 and the strobe pin 98 (e.g., any of the pins used for DQ and DQS in FIG. 1). As such, second loopback signal 104 and/or the third loopback signal 106 may have corresponding frequencies proportional (e.g., half, one-fourth, one-eighth, and so forth) to the frequency of the system clock signals. Accordingly, the signal quality detector 92 may determine a proportionality between the number of edges of the second loopback signal 104 and/or the third loopback signal 106 and the number of edges of the true clock signal 86. The signal quality detector 92 may compare the proportionality between the number of edges and the proportionality of the clock signal frequencies to determine an integrity associated with the internal clock signal 84. In some embodiments, the memory system 80 may include a data buffer 100. The data buffer 100 may be communicatively coupled to the memory device 10 and the host device 82. The data buffer 100 may buffer the second loopback signal 104 and/or the third loopback signal 106 between the memory device 10 and the host device 82.

Figure 5:
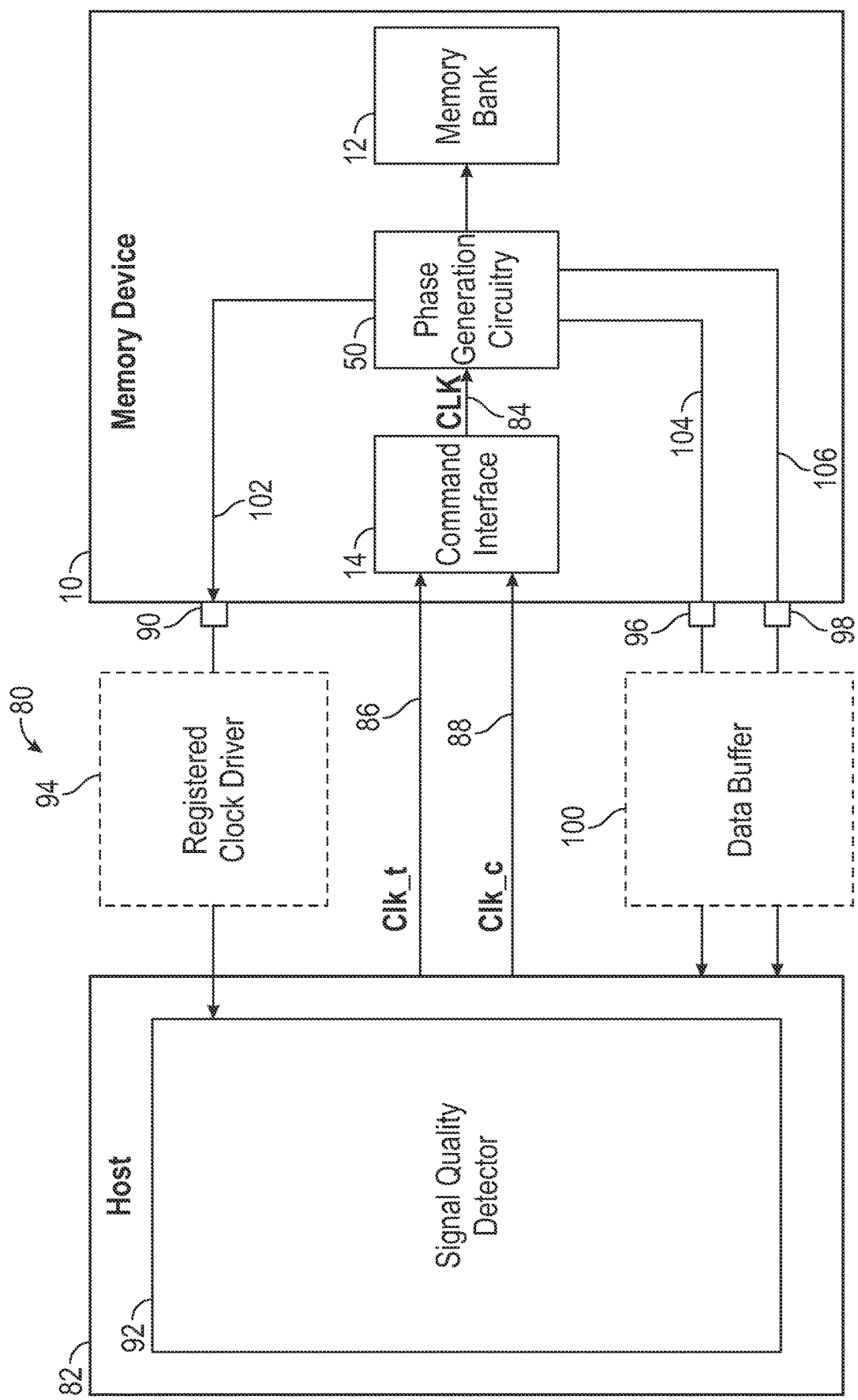
FIG. 5 is a block diagram of the memory system having a first loopback path for an internal clock signal through the loopback data pin and a second datapath for the internal clock signal through the data pin and the strobe pin, according to an embodiment of the present disclosure.

FIG. 5 is a block diagram of another embodiment of the memory system 80 including the memory device 10 and the host device 82. While only a single memory device 10 is illustrated in FIG. 2, the memory system 80 may include any number of memory devices. As illustrated, the memory system 80 may include any number of datapaths for transmitting the internal clock signal 84. For example, the memory system 80 may include the loopback datapath for transmission of the first loopback signal 102 via the loopback data pin 90, the datapath for transmission of the second loopback signal 104 via the data pin 96, and the datapath for transmission of the third loopback signal 106 via the strobe pin 98. As such, the host device 82 may receive the internal clock signal 84 from any of the datapaths and/or any number of the datapaths. Accordingly, if the host 82 receives multiple signals (e.g., the first loopback signal 102, the second loopback signal 104, the third loopback signal 106, or any combination thereof) corresponding to the internal clock signal 84, the memory system 80 may compare the multiple signals (e.g., compare the first loopback signal 102 and the second loopback signal 104). Based on the comparison, the host 82 may identify differences between the loopback signals 102, 104, 106. For example, the host 82 and/or the signal quality detector 92 may determine a first number of edges associated with the first loopback signal 102 and a second number of edges associated with the second loopback signal 104 and/or a frequency ratio between a first frequency associated with the first loopback signal 102 and a second frequency associated with the second loopback signal 104.

Additionally or alternatively, the host 82 may compare one or more of the loopback signals 102, 104, 106 with the true clock signal 86 and/or the bar clock signal 88. For example, the host 82 may determine a first set of differences (e.g., number of edges, frequency ratio) between the system clock signals and the first loopback signal 102, a second set of differences between the system clock signals and the second loopback signal 104, and/or a third set of differences between the system clock signals and the third loopback signal 106. The signal quality detector 92 may determine a difference between the number of edges of the first loopback signal 102 and the number of edges of the true clock signal 86 and/or the bar clock signal 88 to determine an integrity of the internal clock signal 84. For example, the signal quality detector 92 may count fewer edges for the first loopback signal 102 than the true clock signal 86. As such, the signal quality detector 92 may determine an integrity of first loopback signal 102 and, thereby, an integrity of the internal clock signal 84 based on the comparison.

In some embodiments, the signal quality detector 92 may utilize the second loopback signal 104 and/or the third loopback signal 106 as a verification and/or validation of the integrity of the internal clock signal 84. In some embodiments, the signal quality detector 92 may determine the internal clock signal 84 has poor integrity (e.g., greater than threshold difference amount between number of edges) based at least on the first loopback signal 102. As such, after determining the integrity of the internal clock signal 84 is poor based on the first loopback signal 102, the signal quality detector 92 may determine a second difference and/or a third difference between the number of edges of the second loopback signal 104 and/or the third loopback signal 106 and the number of edges of the true clock signal 86 and/or the bar clock signal 88 to verify and/or validate the integrity of the internal clock signal 84 via alternate paths. For example, the signal quality detector 92 may compare the second difference and/or the third difference with the threshold difference amount to determine the integrity of the internal clock signal 84. In some embodiments, the host 82 may generate a new set of termination values based at least in part on the first difference, the second difference, the third difference, or any combination thereof. For example, the host 82 may generate the new set of termination values in response to one or more of the loopback signals 102, 104, 106 indicating a poor integrity of the internal clock signal 84. Alternatively, the host 82 may maintain an original set of termination values in response to one or more of the loopback signals 102, 104, 106 indicating a satisfactory integrity of the internal clock signal 84. While the signal quality detector 92 is described above as first determining the integrity of the internal clock signal based on the first loopback signal 102, the signal quality detector may determine the integrity of the internal clock signal 84 based on any order of the signals 102, 104, 106 and/or any combination of the signals 102, 104, 106.

Additionally or alternatively, the signal quality detector 92 may utilize the second loopback signal 104 and/or the third loopback signal 106 as a redundancy check. The signal quality detector 92 may determine the internal clock signal 84 has satisfactory integrity (e.g., less than a threshold difference amount between number of edges) based at least on the first loopback signal 102. As such, after determining the integrity of the internal clock signal 84 based on the first loopback signal 102, the signal quality detector 92 may determine a second difference and/or a third difference between the second loopback signal 104 and/or the third loopback signal 106 and the true clock signal 86 and/or the bar clock signal 88. Accordingly, the signal quality detector 92 may determine the internal clock signal 84 has satisfactory integrity based at least in part on the first loopback signal 102, the second loopback signal 104, the third loopback signal 106, or any combination thereof.

Figure 6:
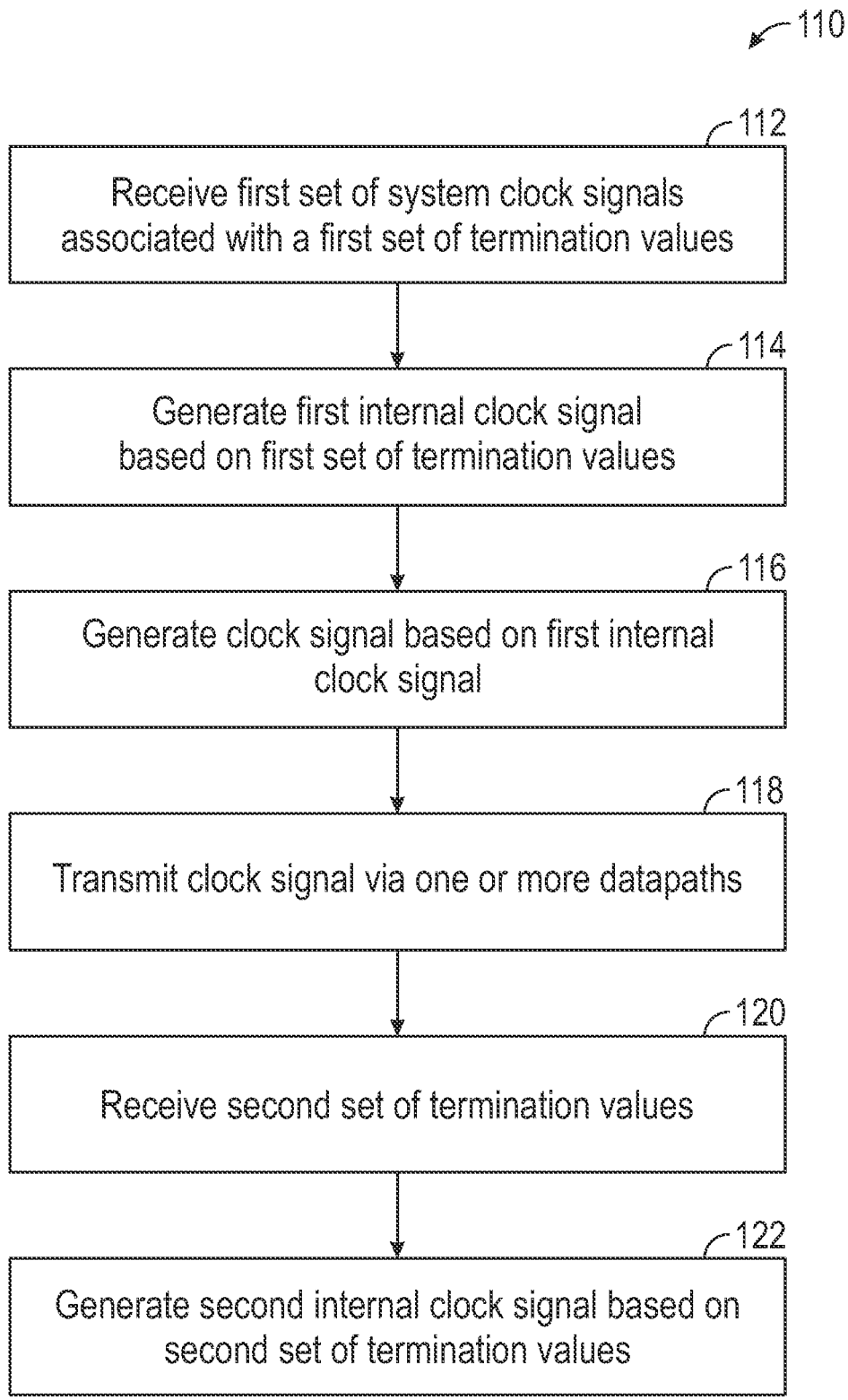
FIG. 6 is a flowchart of a process for internal clock signal quality detection and improvement, according to an embodiment of the present disclosure.

FIG. 6 is a flowchart of a process 110 that may be used for internal clock signal 84 analysis, in accordance with an embodiment of the present disclosure. The process 110 may be implemented by the memory device 10. The memory device 10 may receive (block 112) a first set of system clock signals from the host device 82. For example, the true clock signal 86 and/or the bar clock signal 88 may be associated with a first set of termination values. The memory device 10 may generate (block 114) a first internal clock signal based on the system clock signals and the first set of termination values. The memory device 10 (e.g., the multi-phase generation circuitry 50) may generate (block 116) any number of loopback signals 102, 104, 106 based on the internal clock signal 84. For example, the multi-phase generation circuitry 50 may down sample and/or phase shift the internal clock signal 84 to generate the loopback signals 102, 104, 106.

The memory device 10 may transmit (block 118) the clock signal via one or more loopback datapaths. For example, the memory device 10 may transmit the clock signal via the loopback data pin 90, the data pin 96, and/or the strobe pin 98. The host device 82 may receive the transmitted clock signal and may perform a comparison between the clock signal and the first set of system clock signals. For example, the host device 82 may compare the number of edges of the clock signal and the number of edges of the true clock signal 86 over the same time period. If the number of edges of the clock signal is less than the number of edges of the true clock signal 86, the host device 82 may calculate a second set of termination values. In certain embodiments, the host device 82 may set a proportionality between the number of edges of the clock signal and the number of edges of the true clock signal 86. The host device 82 may determine whether a ratio (e.g., 1:1, 2:1, 4:1, etc.) between the number of edges correlates with a set proportionality constant between a frequency of the true clock signal 86 and a frequency of the clock signal. For example, the host device 82 may determine whether the proportionality constants are the same constant. If so, the host device 82 may verify that the integrity of the internal clock signal 84 is satisfactory. Additionally or alternatively, the memory device 10 may transmit the first loopback signal 102, the second loopback signal 104, the third loopback signal 106, or any combination thereof via corresponding datapaths. The host device 82 may receive the loopback signals and may determine and/or verify an integrity of the internal clock signal 84 based at least in part on the received loopback signals.

If the proportionality constants differ, the host device 82 may generate a new set of termination values. The host device 82 may transmit the new set of termination values to the memory device 10. The memory device 10 may receive (block 120) the second set of termination values. The memory device 10 may adjust termination values based on the new set of termination values. The host device 82 may generate new system clock signals (e.g., a second set of system clock signals) and may transmit the second set of system clock signals to the memory device 10. The memory device 10 may receive the second set of system clock signals and may generate (block 122) a second internal clock signal based at least in part on the second set of system clock signals and the second set of termination values. As such, the host device 82 may improve the integrity of the internal clock signal 84. The memory system 80 may continue to monitor the operation of the memory device 10 and/or improve the integrity of the internal clock signal 84 in this manner.

Additionally or alternatively, the host device 82 may transmit a toggling signal through the command/address pins to determine an integrity of the command/address signals similar to how the host device 82 may determine an integrity of the internal clock 84. For example, the host device 82 may transmit system clock signals through the command/address pins. The memory device 10 may transmit the command/address signals through a loopback datapath to the host device 82, as described herein. The signal quality detector 92 may compare the number of edges of the loopback signal to a number of edges of the system clock signal to determine an integrity of the command/address signals. The host device 82 may update and/or generate a new set of termination values based on the comparison, as described herein.

Thus, the technical effects of the present disclosure include facilitating improved monitoring of memory device operations, for example, by improving signal integrity of an internal clock signal indicative of memory device operation. The method describes utilizing a loopback datapath, a data output path, and/or a strobe output path for transmission of the internal clock signal.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
internal clock generation circuitry configured to receive a first set of system clock signals from a host device and configured to generate a first internal clock signal based at least in part on the first set of system clock signals, the first internal clock signal associated with a first set of termination values;
phase generation circuitry configured to generate a first loopback signal based at least in part on the first internal clock signal;
a first loopback path configured to transmit the first loopback signal to enable the host device to determine a new set of termination values; and
one or more mode registers configured to select the new set of termination values, wherein the internal clock generation circuitry is configured to generate a second internal clock signal associated with the new set of termination values.

2. The memory device of claim 1, wherein the internal clock generation circuitry is configured to receive a second set of system clock signals from the host device.

3. The memory device of claim 2, wherein the internal clock generation circuitry is configured to generate a second internal clock signal based on the second set of system clock signals.

4. The memory device of claim 1, wherein the first loopback path comprises a loopback data pin.

5. The memory device of claim 1, wherein the first loopback path comprises a data pin.

6. The memory device of claim 5, wherein the phase generation circuitry is configured to generate a second loopback signal based at least in part on the first internal clock signal.

7. The memory device of claim 6, comprising a second loopback path configured to transmit the second loopback signal to the host device.

8. The memory device of claim 7, wherein the phase generation circuitry is configured to generate a third loopback signal based at least in part on the first internal clock signal.

9. The memory device of claim 8, comprising a third loopback path configured to transmit the third loopback signal to the host device.

10. A method for operating a memory system to facilitate monitoring operation of a memory device implemented on the memory system, comprising:
receiving, at the memory device of the memory system, a set of system clock signals from a host device;
generating, at the memory device, an internal clock signal from the set of system clock signals;
generating, at the memory device, a first loopback signal and a second loopback signal based at least in part on the internal clock signal;
transmitting, to the host device, the first loopback signal via a first loopback path and the second loopback signal via a second loopback path; and
adjusting, at the memory device, termination values of an internal clock generation circuitry based on received termination values received from the host and based on a comparison between the first loopback signal and the system clock signal, the second loopback signal and the system clock signal, or a combination thereof.

11. The method of claim 10, wherein the first loopback signal is at a first frequency and the second loopback signal is at a second frequency.

12. The method of claim 10, wherein generating the first loopback signal comprises downsampling the internal clock signal.

13. The method of claim 12, wherein the internal clock signal is defined as a double data rate signal.

14. The method of claim 10, further comprising receiving, at the memory device, a second set of system clock signals from the host device.

15. The method of claim 14, further comprising generating, at the memory device, a second internal clock signal from the second set of system clock signals.

16. The method of claim 10, wherein a frequency of the first loopback signal is proportional to a frequency of a first system clock signal of the set of system clock signals.

17. A method, comprising:
receiving, at a memory device, a system clock signal from a host device;
generating, in the memory device, an internal clock signal based at least in part on the system clock signal;
generating, in the memory device, a loopback signal based at least in part on the internal clock signal;
transmitting, from the memory device, the loopback signal via a loopback datapath to enable the host device to determine a set of termination values;
receiving, at the memory device, the set of termination values; and
adjusting, at the memory device, a component of internal clock generation circuitry based on the set of termination values.

18. The method of claim 17, wherein a frequency of the loopback signal is a fraction of a frequency of the system clock signal.

19. The method of claim 17, wherein transmitting the loopback signal comprises transmitting the loopback signal to the host device via a data pin associated with the memory device.

20. The method of claim 17, comprising:
receiving, at the memory device, a second system clock signal from the host device; and
generating, at the memory device, a second internal clock signal based on the second system clock signal, wherein the second internal clock signal is associated with the new set of termination values.

21. A system, comprising:
a host device configured to generate a first set of system clock signals; and
a memory device comprising:
internal clock generation circuitry configured to receive the first set of system clock signals from the host device and configured to generate a first internal clock signal based at least in part on the first set of system clock signals, the first internal clock signal associated with a first set of termination values;
phase generation circuitry configured to generate a first loopback signal based at least in part on the first internal clock signal;
a first loopback path configured to transmit the first loopback signal to enable the host device to determine a new set of termination values; and one or more mode registers configured to select the new set of termination values, wherein the internal clock generation circuitry is configured to generate a second internal clock signal associated with the new set of termination values.

22. The system of claim 21, wherein the host device is configured to generate a second set of system clock signals and the internal clock generation circuitry is configured to receive the second set of system clock signals.

23. The system of claim 22, wherein the internal clock generation circuitry is configured to generate a second internal clock signal based on the second set of system clock signals.

24. The system of claim 21, wherein the first loopback path comprises a loopback data pin.

* * * * *